United States Patent [19]

Benhamou

[11] Patent Number: 4,659,620

[45] Date of Patent: Apr. 21, 1987

[54] INFORMATION MEDIUM ADAPTED TO BE WRITTEN BY THERMO-OPTICAL MEANS AND METHOD OF MANUFACTURING SAME

[75] Inventor: Alain Benhamou, Alfortville, France

[73] Assignee: Societe Anonyme Dite Alcatel Thomson Gigadisc, Paris, France

[21] Appl. No.: 761,866

[22] Filed: Aug. 2, 1985

[30] Foreign Application Priority Data

Aug. 9, 1984 [FR] France ................................ 84 12602

[51] Int. Cl.$^4$ ...................... B32B 15/04; B32B 15/08; B05D 3/06
[52] U.S. Cl. .................................. 428/328; 346/76 L; 346/135.1; 346/137; 427/35; 427/37; 428/336; 428/461; 428/913
[58] Field of Search ............... 428/461, 457, 913, 328, 428/336; 430/945; 346/135.1, 137, 76 L; 427/35, 37

[56] References Cited

U.S. PATENT DOCUMENTS 4,414,273 11/1983 Wada et al. ..................... 428/461 X

FOREIGN PATENT DOCUMENTS 0083396 7/1983 European Pat. Off. ............ 430/945
0090461 10/1983 European Pat. Off. ............ 346/137
2102027 1/1983 United Kingdom ................ 428/457

OTHER PUBLICATIONS

J. A. Thornton (1), Metal Finishing, "Sputter Deposition onto Plastics", Jul. 1976, pp. 46-51.

J. A. Thornton (2), Metal Finishing, "Sputter Deposition onto Plastics", Aug. 1976, pp. 32-34, 40.
Patent Abstracts of Japan, vol. 3, No. 143 (E-154), Nov. 27, 1979, pp. 44E 154, J.P.-A-54 121 154, (Sharp K.K.), 20-09-1979.

*Primary Examiner*—Thomas J. Herbert
*Attorney, Agent, or Firm*—Cushman, Darby & Cushman

[57] ABSTRACT

An information medium adapted to be written by thermo-optical means comprising a heat-sensitive structure adapted to store information to be read by optical means. This includes a thin metal layer, which, when incident writing radiation impinges on it, causes a transient localized temperature rise. Above a temperature threshold this causes a change in the optical characteristics of the heat-sensitive structure. The information medium is manufactured by a method involving depositing a continuous thin film of polycrystalline aggregate over an acceptor surface of the aforementioned structure by means of an incident flux of particles of a precious metal and a transition metal. In order to obtain a defined metallic composition, these metal particles are extracted from at least one target exposed to bombardment by other particles resulting from an electrical discharge in a rare gas at reduced pressure and confined by a magnetic field. The acceptor surface collects these metal particles with a residual energy content giving rise to a density of nucleation sites increased relative to that for a similar deposit obtained by vacuum evaporation. The maximum distance between the target and the acceptor surface is preferably not more than twenty centimeters, and advantageously not more than ten centimeters.

18 Claims, 7 Drawing Figures

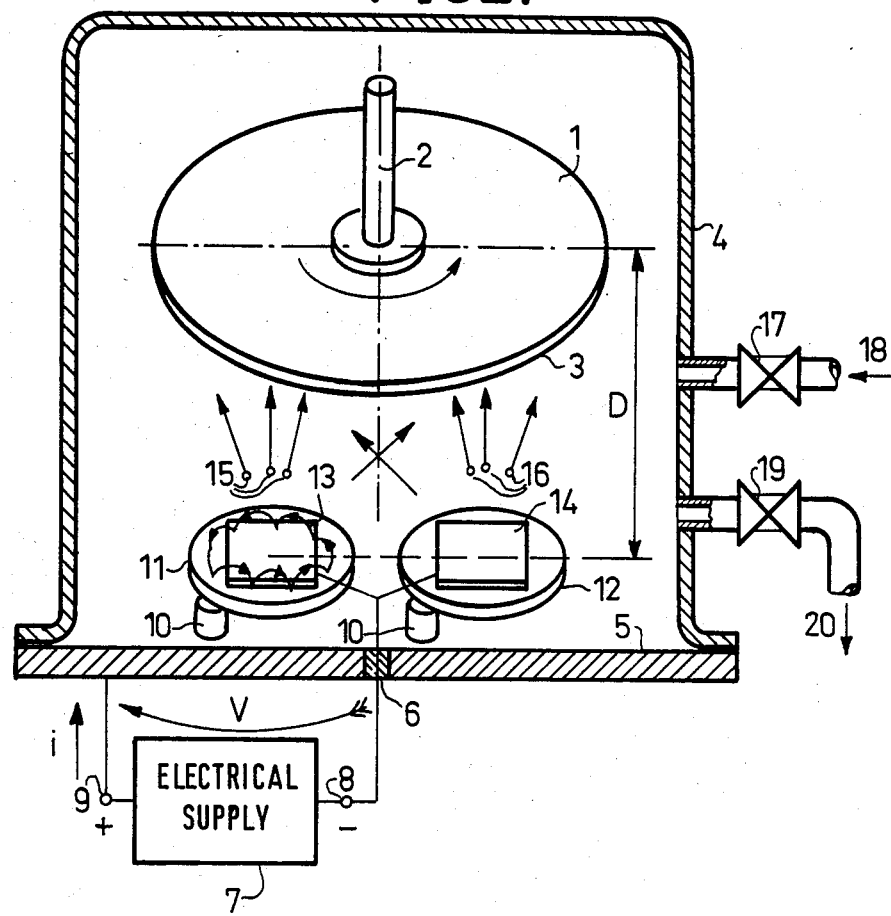
FIG_1
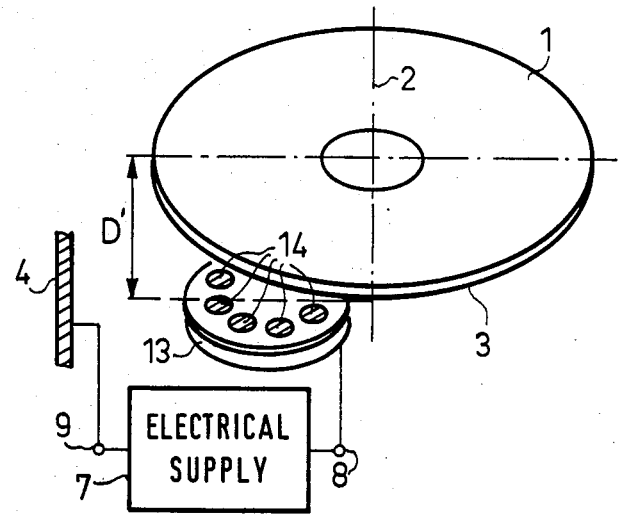
FIG_2

FIG_3
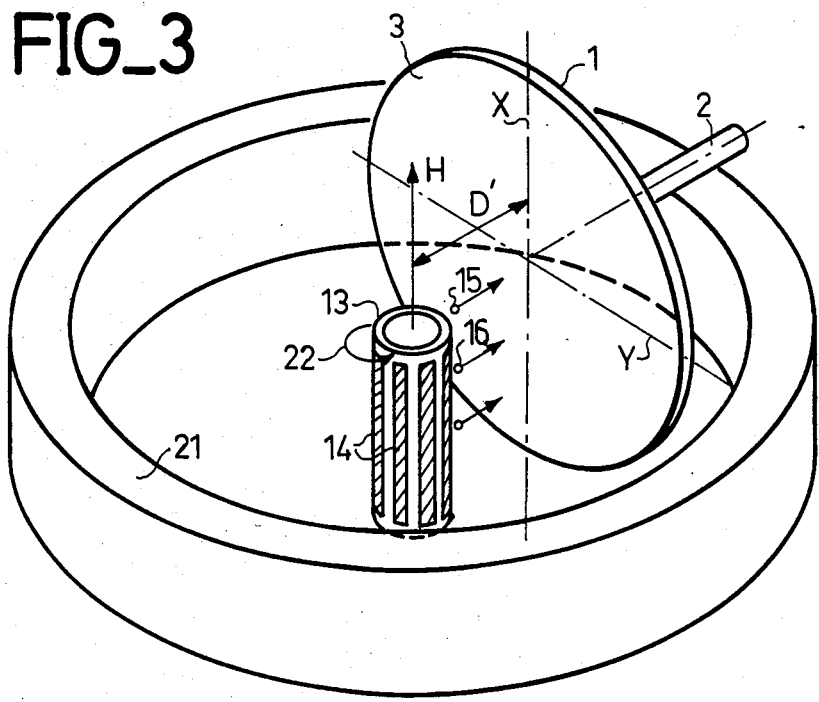
FIG_4
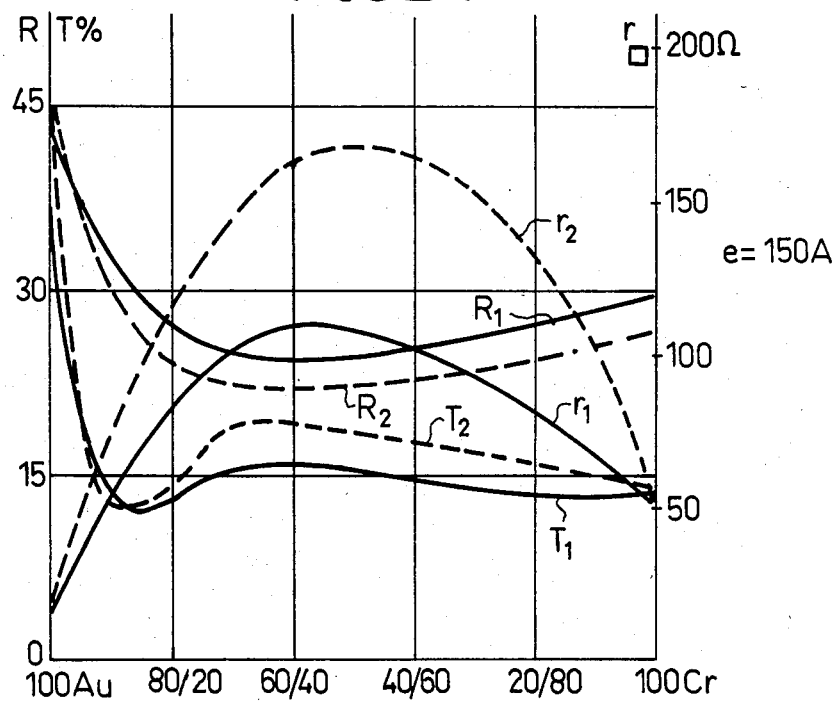

FIG_5
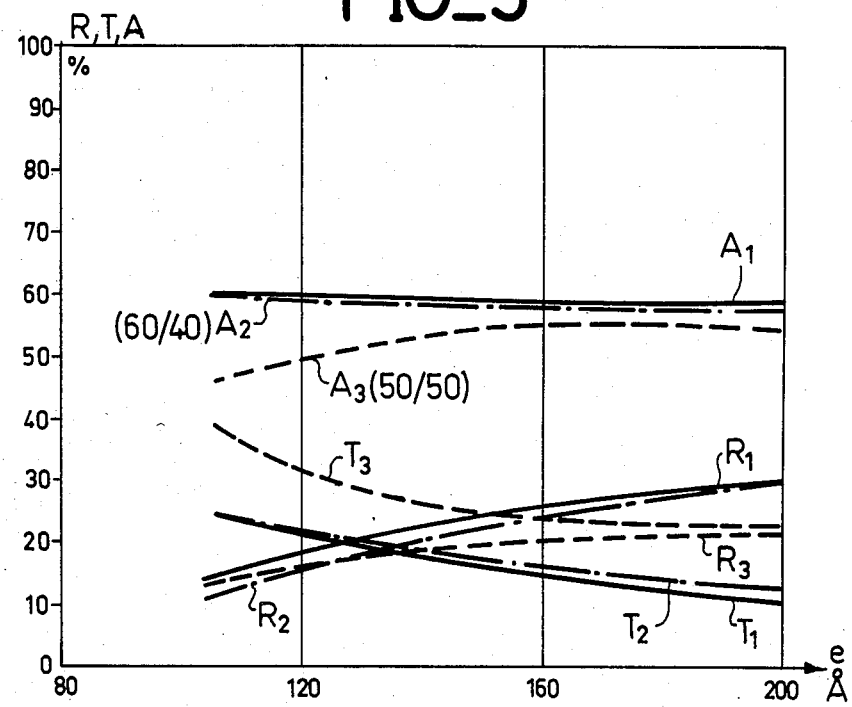
FIG_6
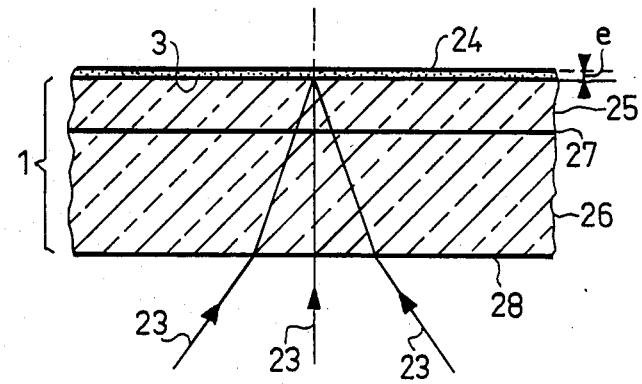
FIG_7
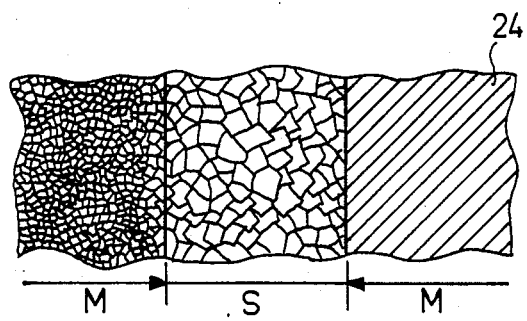

INFORMATION MEDIUM ADAPTED TO BE WRITTEN BY THERMO-OPTICAL MEANS AND METHOD OF MANUFACTURING SAME

BACKGROUND OF THE INVENTION

1. Field of the Invention

The present invention relates to recording information by thermo-optical means.

2. Description of the Prior Art

This recording technique is based on the use of a heat-sensitive structure possessing a reference surface the optical characteristics of which are locally modified. These modifications are readable by optical means and result from interaction caused by a focused laser beam which is scanned over the reference surface and the intensity of which is modulated according to the information to be transcribed.

The thermo-optical recording technique offers the advantage of requiring no processing subsequent to exposure of the photo-sensitive surface, so that the heat-sensitive structure may be protected as soon as it is fabricated by means of an envelope permeable to the writing and reading radiation.

Moreover, the fact that reading may be carried out immediately after writing data facilitates the use of an information medium of this kind as a high information density backing store.

Thermo-optical recording is based on the conversion into heat of as high a proportion as possible of the incident radiant energy.

This presupposes that one extremely thin element of the heat-sensitive structure is capable of absorbing the incident radiation. The heat generated by the impact of the light beam is intended to procure the required modification of optical characteristics by virtue of the temperature rise associated with the generation of heat. For reasons of efficiency and resolution, the transient temperature rise must remain confined within the immediate proximity of the center of the area of impact of the writing beam. When the temperature rise at the center reaches a predefined threshold value it initiates the thermal phase proper of the writing process, which may make use of a phenomenon of ablation, of coalescence, of deformation or of change in texture. In this way it is possible to distinguish optically the areas of the heat-sensitive structure in which the thermal phenomenon has occurred from those which have retained their initial appearance.

The present invention is more particularly directed to depositing a continuous metal film with a thickness between a few tens and a few hundreds of Angströms, this layer constituting in a heat-sensitive structure the incident radiation collecting element which is the source of heat emission; its shape or texture may be changed because of its own transient temperature rise and/or the heating effect which it communicates to an underlying element with which it cooperates. The optically absorbent metal film may typically form part of a heat-sensitive structure entailing the formation of surface irregularities such as craters or bubbles, or structures which retain a virtually smooth appearance but where optical readability results from an optically detectable change of texture.

French patent application No. 80/01423 filed Jan. 23, 1980 by THOMSON-CSF and directed to a "THERMO-OPTICAL INFORMATION WRITING PROCESS AND INFORMATION MEDIUM FOR USE OF THIS PROCESS" describes a thermo-optical writing process which consists in causing a localised loss of adherence at the point of impact of a writing beam between an optically absorbent metal layer and an underlying organic layer of low thermal diffusivity. This loss of adherence is associated with the release of gases which, by expanding, deform the metal layer without rupturing it. French patent application No. 76/31867 filed Oct. 22, 1976 by Thomson Brandt and directed to "INFORMATION RECORDING MEDIUM AND PROCESS FOR RECORDING INFORMATION ON SAME" describes a similar structure with two layers in which the release of gases can cause rupture of the metal layer. Both these documents suggest depositing the metal layer by means of the Joule effect, that is to say by evaporating metals such as gold and chromium in a strong vacuum. U.S. Pat. No. 4,414,273 suggests fabricating a heat-sensitive information medium comprising a heat-sensitive metal layer. It suggests a large number of metals which may be combined including gold and chromium and makes reference to numerous deposition techniques for obtaining thicknesses of the order of 300 to 1,500 Angströms. Sputtering and vapor phase deposition are mentioned in this document.

Thermo-optical exposure of an information medium being intended to employ the impact of a beam of radiation to address a heat-sensitive area, the change of shape or texture must produce a lasting trace in the reference surface scanned by the beam and this trace must be as clear and fine as possible. The function of the metal layer is thus to absorb the radiation, to oppose spreading out of the heat over the surface and, when the change of shape or texture has taken place, to participate in the development of an impression which can be read accurately not only in the short term but also in the long term.

As it is known that the thickness of a thin metal layer is one factor determining its absorbent properties and thermal diffusivity, it is important to determine the composition and the deposition technique which offer the greatest latitude for exposure without losing sight of the required sensitivity, the manufacturing yield and the long-term stability of the heat-sensitive structure. In practice, one seeks to obtain for thicknesses up to 300 Angströms high absorbency associated with low thermal diffusivity. As measuring thermal diffusivity is a delicate matter, it may be deduced from other physical quantities, namely the specific mass and the thermal conductivity. In characterizing a metal deposit qualitatively in terms of thermal conductivity, reliance may be placed on the electrical conductivity, since there is a correlation between these two quantities and the second is easier to measure.

The vacuum evaporation technique using a compound based on a precious metal and an additive metal to form a metal film on the surface of an organic material has been suggested in French patent application No. 80/01423 as constituting a structure element appropriate for writing thermo-optically. Gold cited by way of example makes it possible to achieve resistance to oxidation.

An alloy containing 20% chromium and 80% gold (by weight) in thicknesses from 40 to 100 Angströms has made it possible to achieve high optical absorbency and very significant qualities of hardness and ductility for etching bubbles with an incident laser power of only eight milliwatts. Vacuum evaporation has its disadvantages, however.

The crucible in which the metal constituents are heated is governed by GIBBS' phase law, as a result of which the composition of the deposit is only tenuously related to the content of the crucible. Another disadvantage is associated with the kinetics of the metal particles on approaching the layer support which means that the sites occupied by the first particles attached to the support tend to capture further particles, preventing them from giving rise to numerous nucleation points.

There results a deposit in the form of crystalline aggregates of relatively coarse texture, generally resulting in a relatively low elastic limit. Moreover, vacuum evaporation tends to favor the existence of oxidized abutting regions the thickness of which is non-negligible relative to the overall thickness of the film deposited.

In order to alleviate these disadvantages, the invention proposes to deposit on a support a film of which the initial metal constituents are arranged on a target. This target, placed facing the support, is subject to intense ionic bombardment capable of conferring on the metal atoms extracted from the target sufficient energy to develop on the surface of the support a polycrystalline aggregate having a texture significantly finer than that produced by high vacuum evaporation deposition. This cathode sputtering deposition is effected at reduced pressure in a vacuum enclosure containing a rare gas. Means for magnetically confining the bombardment of the target are provided to permit collection of atoms as close as possible to the target and thus to favor obtaining a multiplicity of nucleation sites, which limits the growth of the grains.

SUMMARY OF THE INVENTION

In one aspect, the present invention consists in a method of manufacturing an information medium adapted to be written by thermo-optical means and comprising a heat-sensitive structure adapted to store information to be read by optical means and having a thin metal layer which, when incident writing radiation impinges on it, causes a transient localized temperature rise which, above a temperature threshold, causes a change in the optical characteristics of said heat-sensitive structure, said method involving depositing a continuous thin film of polycrystalline aggregate over an acceptor surface of said structure by means of an incident flux of particles of a precious metal and a transition metal, in which method, in order to obtain a defined metallic composition, said metal particles are extracted from at least one target exposed to bombardment by other particles resulting from an electrical discharge in a rare gas at reduced pressure and confined by a magnetic field, said acceptor surface collecting said metal particles with a residual energy content giving rise to a density of nucleation sites increased relative to that for a similar deposit obtained by vacuum evaporation.

In another aspect, the invention consists in an information medium manufactured using the above-defined method.

Other objects and advantages will appear from the following description of examples of the invention, when considered in connection with the accompanying drawing, and the novel features will be particularly pointed out in the appended claims.

BRIEF DESCRIPTION OF THE DRAWINGS

FIG. 1 shows cathode sputtering apparatus for implementing the manufacturing method in accordance with the invention.

FIGS. 2 and 3 show variations on the apparatus of FIG. 1.

FIGS. 4 and 5 are explanatory diagrams relating to thin films in accordance with the invention.

FIG. 6 is a view in cross-section of an information support in accordance with the invention.

FIG. 7 is a plan view of a fragment of film that has been written by thermo-optical means.

DESCRIPTION OF THE PREFERRED EMBODIMENTS

In FIG. 1 can be seen the substrate 1 of an information medium during the deposition of a thin metal film. The substrate 1 is, for example, a disk permeable to the writing radiation and which is to receive on its surface 3 a thin metal deposit to absorb this radiation and generate heat. To this end the disk 1 is mounted on a rotary support 2 with the acceptor surface 3 facing towards the base 5 of a cathode sputtering apparatus. The cathode sputtering apparatus comprises a cover 4 which forms with the base 5 an enclosure similar to that of a vacuum evaporation apparatus. To evacuate the enclosure a connector incorporating a valve 19 is connected by a pipe 20 to a vacuum pump. Another connector with a valve 17 is connected to a gas feed pipe. The base 5 is fitted with a sealed electrical lead-through 6 of which the conductor, insulated from the base, is connected to the negative pole 8 of an electrical supply 7. The positive pole 9 of the supply 7 is connected to the base 5. Within the enclosure 4, 5 there are provided two target carriers 11 and 12 situated at a distance D from the surface 3 of the disk 1. Each target carrier 11 and 12 is supported on insulative columns 10 which stand on the base 5.

Two metal targets 13 and 14 are placed on the target carriers 11 and 12, respectively, and electrically connected to the insulated conductor of the sealed lead-through 6. The supply 7 is capable of producing an electrical voltage V of several hundred volts to ionize the gas contained in the cathode sputtering enclosure 4, 5. When such ionization occurs, a current i of the order of one ampere flows from the supply 7.

The deposit to be applied by cathode sputtering must have a composition such that it features good resistance to oxidation. This is why one of the targets 13 or 14 consists of a precious metal such as gold, platinum, etc.

The other target is made of a transition metal serving as an additive. The additive metal is generally more readily oxidized than the precious metal selected. In the remainder of this description the composition of the metal deposit comprises gold and chromium, but other compositions may be considered as indicated in the documents mentioned hereinabove.

Unlike the vacuum evaporation technique, which requires a very high vacuum and does not utilize any electrical discharge to extract the metal particles, the present invention employs a bombardment of a target to extract neutral atoms of the metals to be deposited, which enables metering to be based on the emissive surface of the targets, a geometrical metering process which is much more flexible in use than that which consists in evaporating the metals from heated crucibles. The electrical discharge produced in the enclosure 4, 5 follows on from a pumping operation which reduces the pressure in the apparatus to a value of the order of $2 \times 10^{-6}$ Torr. During this preliminary operation the valve 19 is open and the valve 17 is closed. To make it possible to achieve the electrical discharge with a low supply voltage of the order of 200 volts the valve 17 is opened to admit argon into the enclosure 4, 5 and this addition of rare gas is regulated to achieve a pressure of the order of $3 \times 10^{-3}$ Torr. The rare gas may have added to it another gas such as hydrogen having a significant reducing effect beneficial in preparing the acceptor surface 3 to receive the metal deposit. It is known that with a high vacuum the average free path of the evaporated particles may reach several meters. This is not the case for sputtering with a low argon pressure of $10^{-3}$ Torr, as the average free path of the particles extracted from the target is of the order of five centimeters. Because of more frequent collisions of the detached metal particles with the gas atoms present between the targets 13 and 14 and the disk 1, a distance D of the order of 18 to 20 centimeters is adopted, producing particles the residual kinetic energy of which provides for obtaining a high density of nucleation sites. In the case of vacuum evaporation, the distance D could be much larger since propagation takes place in a highly rarefied medium, but the energy on approaching the substrate is too low to give rise to sharp impacts as soon as the first nucleation sites have been formed. The arriving particles feed these sites without creating new ones, as a result of which the deposit is in the form of a polycrystalline aggregate with relatively coarse texture.

To permit high yield extraction and to limit the extent of the area occupied by the charged particles used to bombard the targets 13 and 14, the invention proposes to equip each target carrier 11, 12 with permanent magnets disposed so as to constrain the electrons which bounce off the target to fall back onto it. This movement with arcuate trajectory is shown in FIG. 1 on top of the target 13. The detached neutral particles 15 and 16 escape such confinement by the magnetic field, but have sufficient kinetic energy to rise above the collisions which they inevitably have with the filling gas. The magnetic field confinement favors close separation of the targets and the acceptor surface 3 of the disk without raising the latter to an exaggerated temperature. Rotating the disk 1 during the deposition of a metal film contributes to the homogeneity of the deposit and makes it possible to reduce the heat transfer. A deposit with a thickness e of 150 Angstroms necessitates sputtering gold and chromium for two minutes, which is entirely satisfactory from the point of view of industrial fabrication process economics. By providing an inlet airlock for the disks, it is possible to achieve a high production yield for deposit thicknesses up to 200 Angstroms and above. Electron microscope examination using very high magnifications shows that a layer deposited with the apparatus of FIG. 1, using 35% by weight of chromium, has the form of a polycrystalline aggregate with an average grain size of the order of 70 Angstroms. The electron diffraction technique makes it possible to see the rings characteristics of the face-centered cubic structure of gold at low magnification.

The crystal lattice of the gold is slightly compressed by the presence of the chromium in interstitial solid solution.

A polycrystalline aggregate of superfine texture may be obtained by modifying the apparatus of FIG. 1.

This variant is shown in FIG. 2, in which it is seen that the target-disk distance has been reduced by half. Use is made of a target 13 of chromium the surface of which subject to the bombardment is partially masked by pads 14 of gold. Thanks to this more compact configuration of the target, it has been possible to reduce the distance D' to eight centimeters. Even with magnifications of the order of $\times 300,000$ to $\times 500,000$, there is seen for chromium concentrations of 50 to 70% a deposit texture in which the grain boundaries are difficult to locate, although it is nevertheless possible to determine that the grain size is below 20 Angstroms. Electron diffraction patterns show diffuse rings. For a sputtered composition containing 60% chromium, a superfine texture is observed and it has been estimated that the grain size is below 15 Angstroms.

Another variation on the apparatus as shown in FIG. 3 has given deposition results similar to those obtained with the arrangement of FIG. 2. Use of a target 13 consisting of a chromium cylinder carrying strips 14 of gold makes it possible to achieve the necessary confinement with a magnetic field H directed along the axis of the cylindrical cathode 13, 14.

This magnetic field is created outside the apparatus by an electromagnet the winding 21 of which is seen in FIG. 3.

The acceptor surface 3 of the disk 1 is disposed parallel to the axis of the cathode. The arcuate trajectory 22 illustrates the movement of the charged particles in the field H and the arrows directed towards the disk 1 represent the movement of the gold and chromium particles 15 and 16. This arrangement lends itself to deposition with masking featuring a radial area of deposition producing a homogeneous film by rotation of the disk around the axis of the support 2. With a distance D' of the order of 10 centimeters, it is possible to obtain a 150 Angstroms layer in 20 minutes when a delimiting mask is provided between the cathode and the surface 3 of the disk 1. It should be noted that the distance between the target and the acceptor surface is substantially halved by adopting the arrangements of FIGS. 2 and 3 as compared with that adopted in the apparatus of FIG. 1. This difference affects the size of the grains which may be explained in part by the influence on the temperature of the substrate which plays a role in the nucleation and growth of thin films.

The deposits obtained by means of the cathode sputtering apparatus which has just been described have been studied in respect of their electrical and optical properties. The deposits were made on glass and the reflectivity R measured using a beam impinging on the deposit through the substrate. The determination of the electrical resistance per square is important for evaluating the thermal resistivity of the deposited films.

FIG. 4 records the measurement results for a deposit of thickness e = 150 Angstroms. On the horizontal axis is plotted the composition by weight in the form of a first number giving the percentage of gold and a second number giving the percentage of chromium, which increases from left to right. The curves in full line represent the reflective power $R_1$ and the transmissive power $T_1$, expressed as percentages, for a deposit produced in the apparatus of FIG. 1. The curve $r_1$ indicates the resistance of this deposit per square. The optical measurements are carried out at a wavelength $\lambda = 632.8$ mm with insufficient power to produce any change in optical characteristics.

The dashed-line curves $R_2$, $T_2$ and $r_2$ relate to a deposit of the same thickness produced with the apparatus shown in FIG. 2. There are not shown any curves corresponding to a deposit obtained with the apparatus shown in FIG. 3, since there is non-negligible oxidation when the deposition time exceeds 2 to 20 minutes.

It seen in FIG. 4 that to the right of a 90/10 composition, that is to say with more than 10% by weight of chromium, the curves $R_1$ and $T_1$ and the curves $R_2$ and $T_2$ are subject to little oscillation and are fairly symmetrical relative to a horizontal line passing through the 20% graduation on the vertical axis. This result is entirely remarkable since it signifies that the fraction of the incident optical radiation absorbed is 60% whatever the percentage of chromium between 10 and 100%. Another remarkable result concerns the curves $r_1$ and $r_2$, which peak in the vicinity of the 60/40 composition. The resistance per square of the sputtered areas is totally reproducible because these layers benefit from good continuity; for applications in the area of thermo-optical transcription of data, the curves yielding this resistance indicate a very low thermal diffusivity which, coupled to a high and constant absorbent power, makes it possible to envisage an efficient writing process, relatively insensitive to the composition and excellently localized at the point of impact of the writing beam. At the peak the 60% gold 40% chromium composition is an order of magnitude better than alloys of analogous composition.

Complementing the results shown in FIG. 4, FIG. 5 is a diagram in which the optical parameters R, T and A are plotted against the thickness e. The absorbent power A is defined by the expression:

$$A = 100 - R - T$$

where R and T are respectively the reflective and transmission powers expressed as percentages.

The subscripts 1 and 2 relate to 60/40 composition deposits obtained with the apparatus of FIGS. 1 and 2. The suffix 3 relates to a 50/50 composition deposit obtained by vacuum evaporation.

It is seen that the films obtained by cathode sputtering are indicated by an absorbent power $A_1$ or $A_2$ higher than the absorbent power $A_3$ of the evaporated deposit. Note also that between 100 and 200 Ångströms the absorbent power of the sputtered films is remarkably independent of the thickness e selected. This means that the thickness parameter is not critical with regard to the opto-thermal efficiency of the film and that in particular it enables the reflective power to be chosen between 15 and 30%, or even between 10 and 30%, with a layer of superfine texture.

The explanation of these surprising results would seem to be linked to the texture of the polycrystalline aggregates and/or to the oxygen content, but it seems clear that reducing the distance separating the target from the acceptor surface (dashed-line curves in FIG. 4) significantly improves fabrication efficiency and tolerance for deposits usable for producing heat-sensitive structures. When deposition is effected using a mixture of rare gas and hydrogen as the filling gas, a reduction in the reflectivity of the deposits is noted. It is known that hydrogen tends to become lodged between grains and that it is an effective chemical reducing agent.

FIG. 6 is a view in cross-section of a heat-sensitive structure using a layer 24 deposited by means of the close cathode sputtering method. One may begin with a glass substrate 26 onto the surface 27 of which is deposited a transparent sub-layer 25 the upper surface 3 of which serves as an acceptor surface for the layer 24. The surface 3 may be prewritten in relief. The information may be written through the substrate 26 and the sub-layer 25 using a focused light beam 23 which enters through the surface 28 of the substrate. This structure permits writing by ablation, but it is also possible to produce detachment of the metal layer 3, without rupturing it, by localized degradation of the sub-layer 25.

By submitting deposits obtained by cathode sputtering to thermo-optical writing, electron microscope examination has shown a change in the texture of the polycrystalline aggregate. FIG. 7 represents the electronic image of a minuscule fragment of the sputtered layer 24 in front view with a central area S which has been subjected to transient heating by irradiation with a laser beam. The adjacent areas M have retained the superfine texture shown in detail to the left in FIG. 7. On the other hand, it is found that the irradiated central area S has a much coarser grain texture. This phenomenon, which would suggest an annealing effect if it were not so ultrafast, of itself constitutes a thermo-optical writing method since the optical characteristics are modified by this change of texture. The fact of having a coarser texture area between two finer texture areas also represents prewriting since the elastic limit of the metal deposit is influenced by the grain size. By exposing it again, this prewriting, which serves as a guide for a writing optical beam, enables data to be written either into the area S or into the adjacent areas M.

A study of the diffraction produced by polycrystalline aggregates obtained by close cathode sputtering a metal composition of gold and chromium has made it possible to characterize the grain size parameters of the deposits.

For concentrations by weight of chromium less than 50% it is the lattice of the gold that is seen with the atom of chromium in interstitial solid solution producing a compression of the gold lattice. With concentrations of chromium in the range from 50 to 60% (a concentration of 50% by weight of chromium is equivalent to an atomic concentration of 78%), the situation tends to become reversed and there is seen beyond this range the cubic lattice of chromium expanded by atoms of gold in interstitial solid solution. Knowing that the limit for solubility by volume of atoms of chromium in gold is in the vicinity of 20%, thin films with high concentrations of gold may be supersaturated with chromium up to a concentration of 40% chromium with this low atomic radius transition metal functioning as a solute compressing the crystal lattice of the substrate. The maxima and minima in the curves in FIG. 4 appear to be linked to the inversion of the crystallographic structure, which changes from the face-centered cubic structure of gold to the cubic structure of chromium beyond a concentration by weight of chromium equal to 40% (this concentration by weight being equivalent to an atomic concentration of 75%).

Also, beyond a concentration of 15% chromium, which is near the limit of solubility by volume of chromium in gold, the change in optical properties is not substantial as compared with that in the electrical properties. The optical properties of the layer seem to be much more closely linked to the chromium over a broad range of compositions. Measurements of the optical absorbent power and of the optical transmission power for a range of wavelengths from 400 to 1,200 nm confirm a general trend oriented towards the optical response of chromium, this being true for concentrations by weight of chromium from 50 to 100%.

It will be understood that various changes in the details, materials and arrangements of parts which have been herein described and illustrated in order to explain the nature of the invention may be made by those skilled in the art within the principle and scope of the invention as expressed in the appended claims.

For example, the invention is not limited to deposition on glass. The acceptor surface may be that of any inorganic or organic support material, and in particular a sub-layer which improves the strength or the continuity of the deposit.

There is claimed:

1. Metal layer for an information medium adapted to be written by thermo-optical means and comprising a heat-sensitive structure adapted to store information to be read by optical means and having a thermal recording metal layer with an overall thickness between 100 and 300 A which, when incident writing radiation impinges on it, causes a transient localize temperature rise which, above a temperature threshold, causes a change in the optical characteristics of said heat-sensitive structure, manufactured by a method wherein said thermal recording metal layer is formed by depositing a continuous thin film of polycrystalline aggregate over an acceptor surface of said structure by means of an incident influx of particles of a precious metal and a transition metal more readily oxidized then said precious metal, in which method, in order to obtain a defined metallic composition, said metal particles are extracted from target means exposed to bombardment by other particles resulting from an electrical discharge in a rare gas at reduced pressure and confined by a magnetic field, said acceptor surface collecting said metal particles with a residual energy content giving rise to a density of nucleation sites increased relative to that for a similar deposit obtained by vacuum evaporation; said target means having an exposed area of said precious metal and an exposed area of said transition metal.

2. Metal layer according to claim 1, wherein the concentration by weight of said transition metal exceeds the limit of solubility by volume in said precious metal.

3. Metal layer according to claim 2, wherein the grain texture is varied by pre-writing heat treatment.

4. Metal layer according to claim 1, forming a polycrystalline aggregate having an average grain size not exceeding 70 Angströms.

5. Metal layer according to claim 4, wherein said average grain size does not exceed 20 Angströms.

6. Metal layer according to claim 1, wherein one of said transition and precious metals is in solid solution in the other of said metals.

7. Metal layer according to claim 6, wherein said precious metal is gold and said transition metal is chromium.

8. Metal layer according to claim 7, wherein the concentration by weight of gold is substantially 60%.

9. Method of manufacturing an information medium adapted to be written by thermo-optical means and comprising a heat-sensitive structure adapted to store information to be read by optical means and having a thermal recording metal layer with an overall thickness between 100 and 300 A which, when incident writing radiation impinges on it, causes a transient focalized temperature rise which, above a temperature threshold, causes a change in the optical characteristics of said heat-sensitive structure, said method comprising forming a thermal recording metal layer by depositing a continuous thin film of polycrystalline aggregate over an acceptor surface of said structure by means of an incident flux of particles of a precious metal and a transition metal more readily oxidized than said precious metal, in which method, in order to obtain a defined metallic composition, said metal particles are extracted from target means exposed to bombardment by other particles resulting from an electrical discharge in a rare gas at reduced pressure and confined by a magnetic field, said acceptor surface collecting said metal particles with a residual energy content giving rise to a density of nucleation sites increased relative to that for a similar deposit obtained by vacuum evacuation; said target means having an exposed area of said precious metal and an exposed area of said transition metal.

10. Method according to claim 9, wherein the maximum distance between said target and said acceptor surface is twenty centimeters.

11. Method according to claim 9, wherein the maximum distance between said target and said acceptor surface is ten centimeters.

12. Method according to claim 9, wherein said target functions as a cathode.

13. Method according to claim 9, wherein said transition metal is chromium.

14. Method according to claim 9, wherein said precious metal is gold.

15. Method according to claim 9, wherein said rare gas is argon.

16. Method according to claim 9, wherein said reduced pressure is substantially $3 \times 10^{-3}$ Torr.

17. Method according to claim 9, wherein said target means comprise A target fabricated from one of said metals; the surface of said target exposed to said bombardment being partially covered by elements fabricated from the other of said metals.

18. Method according to claim 17, wherein the exposed surface of said target is cylindrical and said magnetic field is parallel to the axis of said surface.

* * * * *